United States Patent

Philofsky et al.

[15] 3,647,935

[45] Mar. 7, 1972

[54] INTERMETALLIC PASSIVATION OF ALUMINUM METALLIZATION

[72] Inventors: Elliott M. Philofsky; Kim Ritchie, both of Phoenix, Ariz.

[73] Assignee: Motorola, Inc., Franklin Park, Ill.

[22] Filed: Dec. 15, 1969

[21] Appl. No.: 885,181

[52] U.S. Cl. ..........................174/68.5, 29/590, 317/101 A, 317/234 M

[51] Int. Cl. ..........................H01l 1/14

[58] Field of Search ..........................174/68.5; 317/101 A, 234; 29/590

[56] References Cited

UNITED STATES PATENTS 3,436,615 4/1969 Finlayson..........................317/234 UX

*Primary Examiner*—Darrell L. Clay
*Attorney*—Mueller and Aichele

[57] ABSTRACT

An electrically conductive intermetallic coating which is resistant to corrosion serves as a passivating layer on an aluminum metallization. The preferred intermetallic is $AuAl_2$. The intermetallic passivating layer protects the aluminum metallization from chemical attack thereby increasing device lifetime and stability.

5 Claims, 2 Drawing Figures

INVENTORS
Elliott M Philofsky
Kim Ritchie
BY
Mueller, Aichele, & Rauner
Attys

INTERMETALLIC PASSIVATION OF ALUMINUM METALLIZATION

BACKGROUND OF THE INVENTION

Aluminum is the most common contact metallization in use today in the fabrication of silicon transistors and in integrated circuits. Aluminum metallization is, however, subject to corrosion when exposed to halogen ions and deteriorates rapidly as a result thereof. For example, in plastic encapsulated discrete devices, the plastic contains fluorine, chloride, sodium, potassium and the like ions. These ions, and especially the chloride ion, under operating conditions in which water is present, tend to corrode the aluminum. The chloride ion reacts with the aluminum metallization to form aluminum chloride which dissolves in water, thereby forming a void in the strip which results in device failure.

A problem encountered with aluminum metallization in integrated circuits occurs as a result of the passivating glass which is placed over the integrated circuit. This passivating glass is etched away in order to make a contact with the aluminum bonding pad below. This passivating glass, however, is etched unevenly with the hydrofluoric acid etchants used, thereby resulting in corrosive attack on the aluminum metallization or bonding pads in those areas where the glass is etched away most rapidly. The hydrofluoric acid then etches and/or dissolves the aluminum metallization which results in these aluminum bonding pads being too thin for subsequent wire bonding.

SUMMARY OF THE INVENTION

It is an object of this invention to passivate aluminum metallization. It is yet another object of this invention to protect the aluminum metallization from corrosive attack by halogen ions. It is another object of this invention to increase the lifetime of semiconductor devices.

These and other objects are accomplished by coating the aluminum metallization with an electrically conductive intermetallic which is inert to corrosion. The preferred intermetallic is $AuAl_2$, a gold aluminum intermetallic. A preferred method of passivating aluminum metallization involves coating the aluminum metallization with a thin layer of gold and subsequently heating the gold-coated aluminum metallization to form the desired gold aluminum intermetallic, $AuAl_2$.

Further objects and advantages of the present invention will be apparent from the following detailed description, reference being made to the accompanying drawings wherein preferred embodiments of this invention are shown.

IN THE DRAWINGS

DESCRIPTION OF THE ILLUSTRATIVE EMBODIMENT

Figure 1:
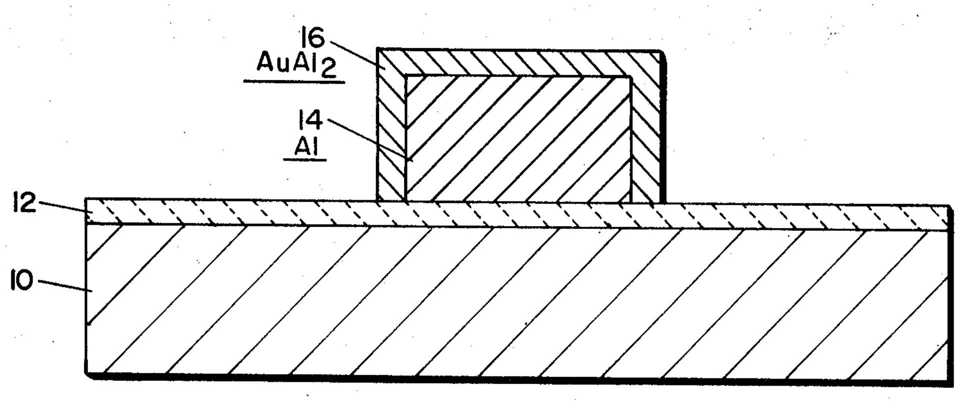
FIG. 1 is a cross-sectional side view of a semiconductor having an intermetallic coating on the aluminum metallization which is insulated from the substrate.
Figure 2:
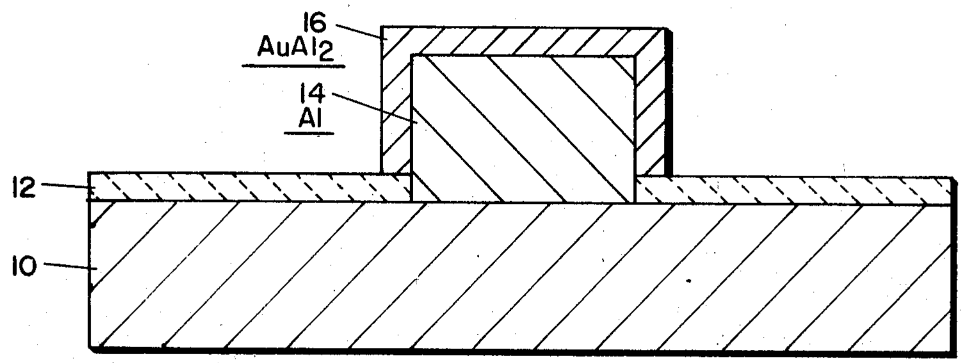
FIG. 2 is a cross-sectional side view of a semiconductor having an intermetallic coated aluminum metallization in contact with the substrate.

As shown in FIGS. 1 and 2, a silicon substrate 10 has an aluminum metallization 14 positioned thereon. The aluminum metallization 14 may be separated from the substrate 10 by an insulative layer 12, for example, silicon dioxide, as shown in FIG. 1 or the aluminum metallization 14 may be in ohmic contact with the silicon substrate 10 as shown in FIG. 2. The substrate may be any semiconductor material such as silicon, germanium, and the group III–V semiconductors. Silicon is the preferred semiconductor material. The aluminum metallization layer 14 is widely used throughout the industry since it makes excellent ohmic contact with the silicon semiconductor.

In accordance with this invention, a layer of an intermetallic 16 coats the aluminum metallization 14. The intermetallic 16 material has to be electrically conductive, that is, have a low electrical resistivity. The electrical resistivity should be less than 20 micro-ohms-cm. The intermetallic 16 should be resistant to corrosion, especially corrosion caused by the chloride ion. The preferred intermetallic is $AuAl_2$ which has a high electrical conductivity, that is, a low electrical resistivity of about 8 micro-ohms-cm. The $AuAl_2$ intermetallic is much more resistant than aluminum to attack by many acid and basic solutions. $AuAl_2$ also prevents the aluminum from electromigrating over the surface. The presence of the intermetallic $AuAl_2$ increases the lifetime of circuits running at high current densities and/or high temperatures. Instead of intermetallics, coatings which may be used are CrSi, $NbSi_2$, and $TaSi_2$. The thickness of the layer 16 is from about 1,500 to 4,500 angstroms.

The intermetallic materials may be applied by standard techniques. A preferred technique for forming a layer of $AuAl_2$ is to coat the aluminum with a layer of gold and then heat the gold-plated aluminum metallization to a temperature to cause the gold to react with the aluminum to form the $AuAl_2$. A layer of gold having a thickness of 500 to 1,500 angstroms of gold is preferred in the practice of this invention. A temperature of from 200° to 400° C. is suitable for causing the gold coating to react with the aluminum metallization to form the intermetallic layer of $AuAl_2$. The reaction time at a temperature of 350° to 400° C. is of the order of a few seconds. The resultant intermetallic layer $AuAl_2$ having a thickness of 1,500 to 4500 angstroms is colored purple. After the $AuAl_2$ passivating layer is formed, the wafer is then rinsed in water and the excess gold which does not adhere to the $SiO_2$ will be washed away, thereby leaving the structure shown in FIGS. 1 and 2. Gold wire is then bonded by thermal compression techniques to form a stable bond therebetween.

EXAMPLE 1

A silicon semiconductor device made by the method described above having an $AuAl_2$ coating 1,500 angstroms thick on the aluminum metallization was compared with a device which did not have the $AuAl_2$ passivating layer thereon for stability when subjected to boiling water for 500 hours. At the end of this time period, 80 percent of the devices which did not have the passification layer thereon failed, whereas only 12.5 percent of the devices having an $AuAl_2$ layer thereon failed.

In another stability test, MIL–STD–202C, method 106B, in which the $V_{CB}$=25V (65° C. for 3 hours at 98 percent RH and 25° C. for 1 minute), 70 percent of the unpassivated devices failed after 1,000 hours, whereas 7.5 percent of the devices failed which had a coating of $AuAl_2$ thereon.

What is claimed is:

1. A method of passivating an exposed aluminum metallization on a semiconductor comprising the steps of
   depositing gold on all of said exposed aluminum metallization to cover all of the said exposed aluminum metallization, and
   converting all of said gold deposited on said aluminum metallization to $AuAl_2$ by heating at an elevated temperature.
2. A method as disclosed in claim 1 wherein the step of depositing said gold is depositing gold to a thickness of 1,000 to 2,000 angstroms.
3. A method as described in claim 1 wherein the step of heating said gold deposited aluminum metallization is heating to a temperature of 200° to 400° C.
4. A semiconductor device comprising
   a semiconductor substrate,
   an exposed aluminum metallization positioned on said substrate, and
   a layer of an electrically conductive intermetallic $AuAl_2$ on and covering all of said exposed aluminum metallization, said conducting intermetallic being relatively inert to corrosion caused by the chloride ion.

5. A device as disclosed in claim 4 wherein an insulative layer is interposed between said aluminum metallization and said semiconductor substrate.

* * * * *